(12) United States Patent
Burney et al.

(10) Patent No.: US 7,468,613 B1
(45) Date of Patent: Dec. 23, 2008

(54) METHODS AND APPARATUS FOR CONTROL AND CONFIGURATION OF PROGRAMMABLE LOGIC DEVICES

(75) Inventors: Ali H. Burney, Fremont, CA (US); Daniel R. Mansur, Emerald Hills, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/893,722

(22) Filed: Aug. 16, 2007

Related U.S. Application Data

(62) Division of application No. 10/980,963, filed on Nov. 4, 2004, now Pat. No. 7,274,212.

(51) Int. Cl.
*G06F 7/38* (2006.01)
*H03K 19/173* (2006.01)

(52) U.S. Cl. .............................. 326/38; 326/39; 326/41

(58) Field of Classification Search ............. 326/38–41, 326/47
See application file for complete search history.

(56) References Cited

U.S. PATENT DOCUMENTS

| | | | |
|---|---|---|---|
| 6,738,962 | B1 | 5/2004 | Flaherty et al. |
| 6,851,047 | B1* | 2/2005 | Fox et al. ..................... 713/1 |
| 6,886,092 | B1 | 4/2005 | Douglass et al. |
| 2004/0117755 | A1* | 6/2004 | Blodget et al. ............. 716/17 |
| 2005/0084076 | A1 | 4/2005 | Dhir et al. |

OTHER PUBLICATIONS

U.S. Appl. No. 09/879,397, filed Jun. 12, 2001, Flaherty.

* cited by examiner

*Primary Examiner*—Anh Q Tran
(74) *Attorney, Agent, or Firm*—Ropes & Gray LLP; Robert R. Jackson; Chia-Hao La

(57) ABSTRACT

Circuitry and methods are provided for control and configuration of a PLD. An embodiment of the invention comprises hard IP circuitry embedded in the PLD. The circuitry may include a gigabit MAC, a hard processor, and a DMA engine. The invention permits a variety of operations, including real-time control and remote programming, without the use of dedicated external circuitry.

6 Claims, 3 Drawing Sheets

METHODS AND APPARATUS FOR CONTROL AND CONFIGURATION OF PROGRAMMABLE LOGIC DEVICES

CROSS-REFERENCE TO RELATED APPLICATION

This application is a division of U.S. patent application Ser. No. 10/980,963, filed Nov. 4, 2004, which is hereby incorporated by reference herein in its entirety.

BACKGROUND OF THE INVENTION

Programmable logic devices ("PLDs") are well known in the art. They provide reprogrammable logic in the form of lookup tables, interconnect, and the like. Their flexibility allows a single architecture to be used for many different functions, which can yield lower system cost and faster development time than other solutions, such as application-specific integrated circuits ("ASICs"). Illustrative PLDs are described in detail in Cliff et al. U.S. Pat. No. 5,689,195 and Jefferson et al. U.S. Pat. No. 6,215,326, which are hereby incorporated by reference in their entirety. As used herein, a PLD refers to any integrated circuit ("IC") with programmable logic. Thus, a hybrid IC with both programmable and hard-wired logic, such as a structured ASIC, is still referred to herein as a PLD.

One potential disadvantage of using PLDs is reduced performance in certain scenarios. For instance, a soft (reprogrammable) processor on the PLD may not be able to perform some real-time control operations, such as monitoring the PLD's status and reporting that status to an appropriate master device. Such difficulties are often overcome by using a separate external processor which is mounted on the same board as the PLD. The PLD may communicate with that processor using a high-speed transfer mechanism, such as a gigabit media access controller ("MAC").

Similarly, real-time remote configuration of the PLD often requires the use of an external processor, a high-speed transfer mechanism, and a direct memory access ("DMA") engine. Although solutions involving dedicated external circuitry are generally effective, their cost can often be quite high.

In view of the foregoing, it would be desirable to provide circuitry and methods enabling real-time control and configuration of a PLD while reducing system cost.

SUMMARY OF THE INVENTION

In accordance with this invention, circuitry and methods are provided for performing real-time operations using an embedded control and configuration unit in the PLD. System cost is reduced by eliminating at least part of the external circuitry previously required. The unit may be implemented with hard intellectual property ("IP") blocks, which permit higher performance than soft IP circuitry. An exemplary embodiment of the invention may include a hard processor, a gigabit MAC, and a DMA engine.

The embedded control and configuration unit of the invention may support several modes of operation. Programming mode permits execution of the PLD's startup sequence and programming of the PLD using stored configuration data. In user mode, the unit may be used for normal PLD control and chip-to-chip communication. Finally, standby mode permits low power consumption while still monitoring incoming packets for a change in status.

The invention therefore advantageously provides real-time control and configuration for a PLD without the need for external circuitry. System cost is reduced without any substantial loss in performance.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
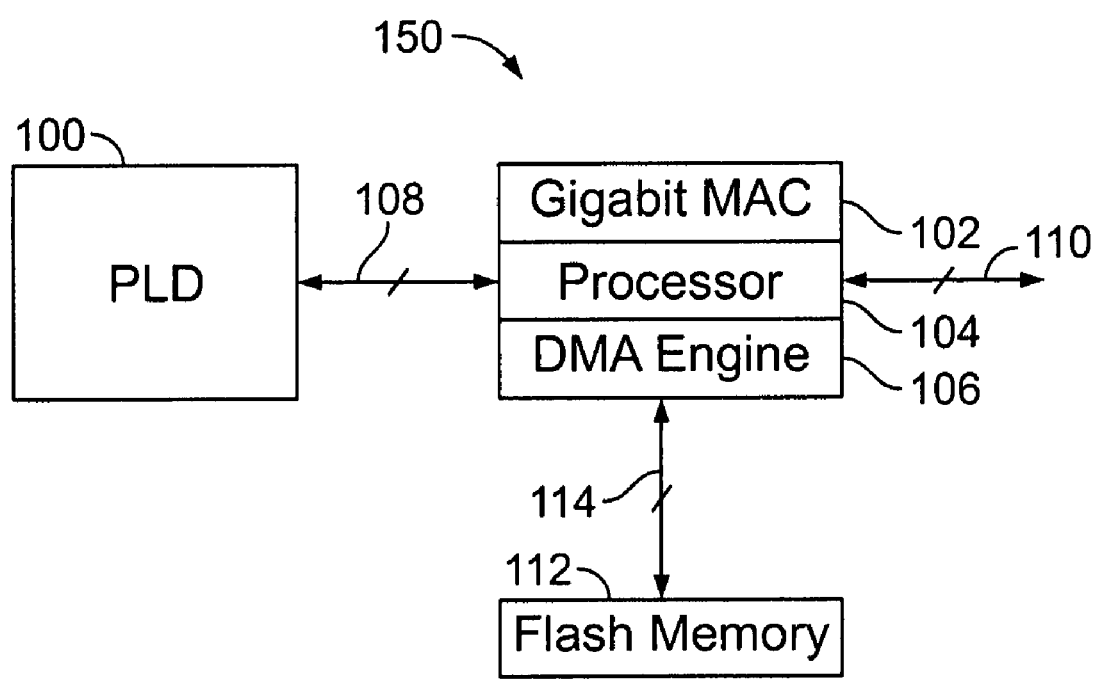
FIG. 1 is a block diagram showing an illustrative PLD using external circuitry for control and configuration.

FIG. 1 is a block diagram showing an illustrative PLD 100 using external circuitry 150 for control and configuration. External circuitry 150 includes gigabit MAC 102, processor 104, and DMA engine 106. The components of external circuitry 150 can communicate with each other. This communication can be achieved through a shared bus, through hard-wired connections, or through any other suitable communication means. In addition, external circuitry 150 communicates with PLD 100 using bus 108.

Flash memory 112 is connected to DMA engine 106 via bus 114. Flash memory 112 may store programming configuration files that are to be loaded into PLD 110. The loading can be performed when PLD 100 is first started up, or afterwards (configuration that is performed after startup is sometimes referred to as reconfiguration). The configuration data contained in those files is accessed using DMA engine 106 and communicated to PLD 100 using gigabit MAC 150 and bus 108. This transfer mechanism enables real-time remote programming of PLD 100.

External circuitry 150 communicates with other external circuitry using bus 110. For example, gigabit MAC 102 can receive remote programming instructions for configuring PLD 100 through bus 110, causing DMA engine 106 to transfer configuration data from flash memory 112 to PLD 100 as described above. In another example, PLD 100 can send status information to processor 104 using bus 108. The information may be sent via gigabit MAC 102 or directly to processor 104. Processor 104 then processes the received information and sends appropriate commands or data to other circuitry, such as a control card, via bus 110. Again, the commands or data may be sent directly from processor 104 or by way of gigabit MAC 102.

Although the setup shown in FIG. 1 effectively performs control and configuration of PLD 100, the cost of providing external circuitry 150 can be quite large. An alternative approach would be to encapsulate the functionality of external circuitry 150 in PLD 100, by programming some of the circuitry to perform the needed functions. Unfortunately, programmable circuitry often lacks the performance necessary for real-time control and configuration functions, such as those described above. In particular, soft processors may not have the requisite speed for complex real-time operations, such as comprehensive monitoring of PLD 100.

Figure 2:
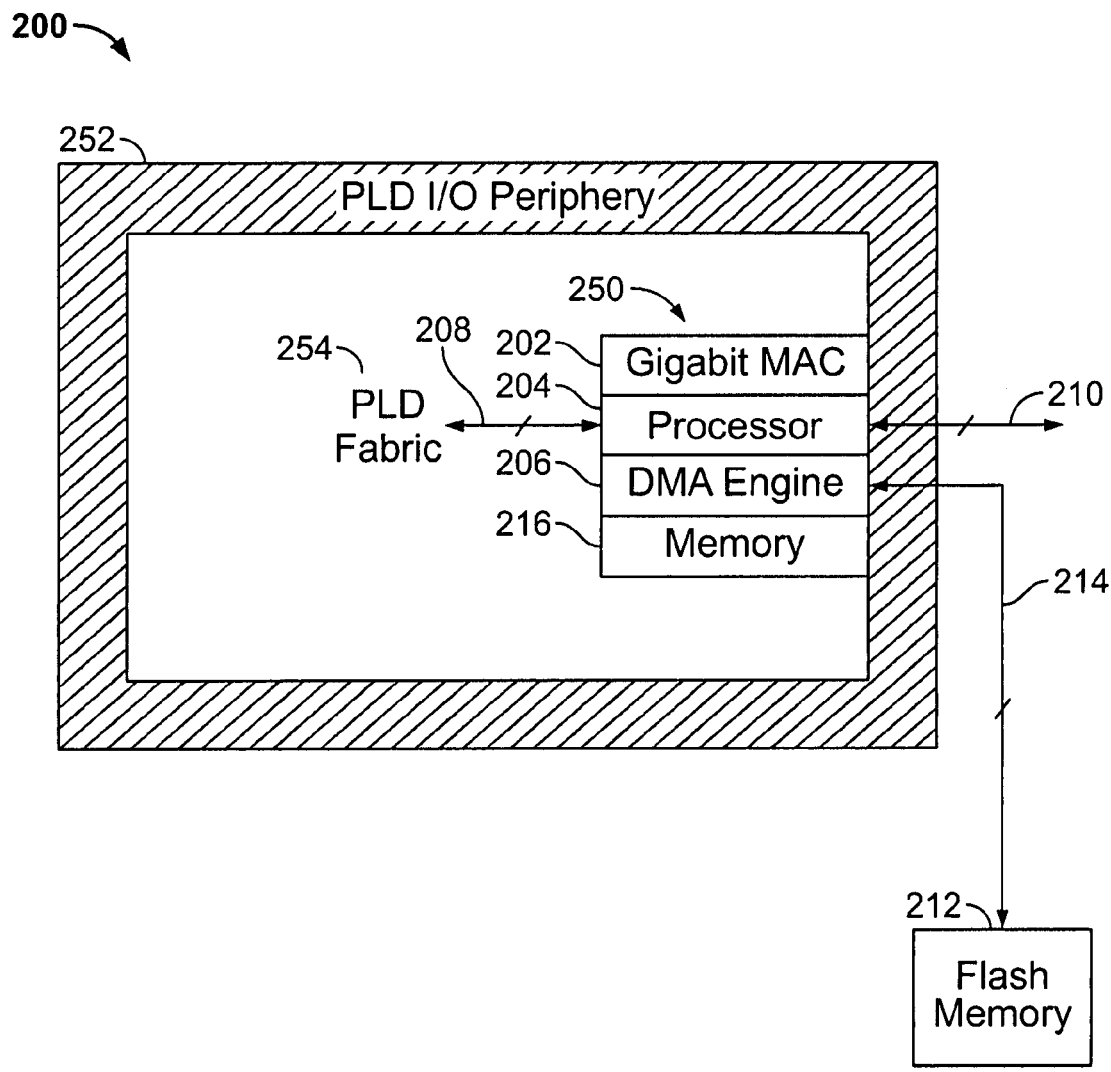
FIG. 2 is a block diagram of an illustrative PLD incorporating a control and configuration unit according to the invention.

A solution to this dilemma is shown in FIG. 2, which is a block diagram of an illustrative PLD 200 incorporating a control and configuration unit 250 according to the invention. PLD 200 includes PLD input/output ("I/O") periphery 252, which surrounds PLD fabric 254. PLD fabric 254 is sometimes referred to as the PLD core, and can comprise lookup tables, interconnect, and the like.

Control and configuration unit 250 is a hard intellectual property ("IP") block, and is embedded in PLD 200. Unit 250 can be implemented using any suitable technology, such as standard-cell, custom, or gate array logic. In an embodiment, control and configuration unit 250 may be placed along one of the edges of PLD 200, as shown. Thus, unit 250 can communicate with external circuitry via PLD I/O periphery 252 on one side, and with PLD fabric 254 on the three remaining sides.

Control and configuration unit 250 may include a gigabit MAC 202, a processor 204, and a DMA engine 206. In addition, control and configuration unit 250 may include optional memory 216. The components of control and configuration unit 250 can communicate with each other through a shared bus, through direct connections, or through any other suitable communication means. It should be noted that, although FIG. 2 shows control and configuration unit 250 interfacing to PLD fabric 254 through one side (in this example, the left side), unit 250 can actually interface with PLD fabric 254 through any combination of the three sides which are not connected to PLD I/O periphery 252.

Control and configuration unit 250 is connected to PLD fabric 254 via bus 208 using an appropriate interface, such as a first-in-first-out ("FIFO") queue or the Avalon/Atlantic® interface currently used by Altera Corp. of San Jose, Calif. Similarly, unit 250 is connected to external circuitry through bus 210. DMA engine 206 is connected to flash memory 212 through bus 214. Both buses 210 and 214 operate through PLD I/O periphery 252.

Gigabit MAC 202 enables high-speed communication with external circuitry using bus 210, which works through PLD I/O periphery 252. Gigabit MAC 202 may include circuitry configured to support any appropriate communication protocol, such as Ethernet or PCI-Express. In addition, gigabit MAC 202 can support any suitable communication speeds, such as 1 gigabit per second ("GB"), 10 GB, or 10/100 GB. Gigabit MAC 202 can communicate with external circuitry to receive instructions on real-time remote programming of PLD 200, transmit information on the status of PLD 200, or perform any other suitable communication. In one embodiment, gigabit MAC 202 is compatible with the Ethernet Blaster® connector used by Altera Corp. of San Jose, Calif.

Processor 204 can be any suitable processor, such as a member of the Nios® line of embedded processors currently used by Altera Corp. of San Jose, Calif. Processor 204 is adapted to performing high-speed operations in real-time. Such operations may include, for example, monitoring the power consumption and temperature of PLD 200, performing real-time remote programming of PLD 200, and the like. Processor 204 could also support various protocols, for example by including circuitry that implements a stack for Transmission Control Protocol ("TCP") and Internet Protocol ("IP") communication.

DMA engine 206 communicates with flash memory 212 via bus 214, which works through PLD I/O periphery 252. Flash memory 212 can store configuration files that are used in the programming of PLD 200. These files can be retrieved by DMA engine 206 during device startup or any other suitable time. For instance, even after PLD 200 has been programmed upon startup, new configuration files may be loaded into flash memory 212 and subsequently used to program PLD 200. Although the embodiment in FIG. 2 shows DMA engine 214 communicating directly with flash memory 212, the communication could also be performed through gigabit MAC 202. In this case, there would be some overlap between buses 210 and 214.

Flash memory 212 can be any memory suitable for bulk programming of PLD 200, such as configuration random access memory ("CRAM") and the like. In addition, optional memory 216 can store configuration files for programming PLD 200, thereby serving a role similar to that of flash memory 212. Memory 216 can also serve any other suitable purpose, such as buffering data communicated via buses 208 and 210, or storing information necessary for the encryption and decryption of transmitted data. Memory 216 can include random access memory ("RAM"), read-only memory ("ROM"), FIFO queues, or any other type of suitable memory.

Control and configuration unit 250 can support several modes of operation. For instance, programming mode permits execution of the PLD's startup sequence. In one embodiment, configuration files from flash memory 212 may be streamed into PLD 200 via gigabit MAC 202 upon startup. Programming mode may also allow programming of PLD 200 at times after startup (e.g., reconfiguration).

User mode of control and configuration unit 250 allows the unit to be used for normal control of PLD 200 and for chip-to-chip communication. This control and communication may include monitoring of the status of PLD 200 and reporting this status to outside circuitry. In addition, control and configuration unit 250 can receive data from outside circuitry (e.g., via gigabit MAC 202). After this data is processed (if appropriate), it can be forwarded to PLD fabric 254 using an appropriate interface.

Finally, standby mode of control and configuration unit 250 permits low power consumption over extended periods of time. A user can issue a command to enter this mode (e.g., via gigabit MAC 202). In one embodiment, gigabit MAC 202 can continue to monitor incoming packets during standby mode. Thus, control and configuration unit 250 can detect a change of status if data indicative of the change is received, thereby triggering an exit from standby mode. Even while PLD 200 is in standby mode, the user may still be permitted to access flash memory 212, memory 216, or both (e.g., via gigabit MAC 202). If desired, the user can also download configuration files from the accessed memory.

It should be noted that the embodiment of the invention shown in FIG. 2 is merely illustrative. For instance, control and configuration unit 250 could be implemented with different components than those shown, as long as the desired components are supported by the hard IP technology of the particular PLD. In addition, unit 250 could include more than one gigabit MAC (e.g., one enabling Ethernet communication and another enabling PCI-Express communication). Also, control and configuration unit 250 can be configured along any suitable edge of PLD 250, and can be replicated multiple times within a single PLD, e.g., to provide additional bandwidth.

Control and configuration unit 250 therefore provides a number of benefits over alternative solutions. As noted before, the embedding of the unit in PLD 200 leads to reduced system cost. Since unit 250 is implemented with hard IP, its performance allows real-time operations to be conducted on PLD 200. Such operations would probably not be supported by a soft implementation of the same features. In addition, embedded hard IP unit 250 occupies less area and consumes less power than its equivalent soft logic implementation. Finally, the hard IP platform provides the option of implementing other features if desired.

Figure 3:
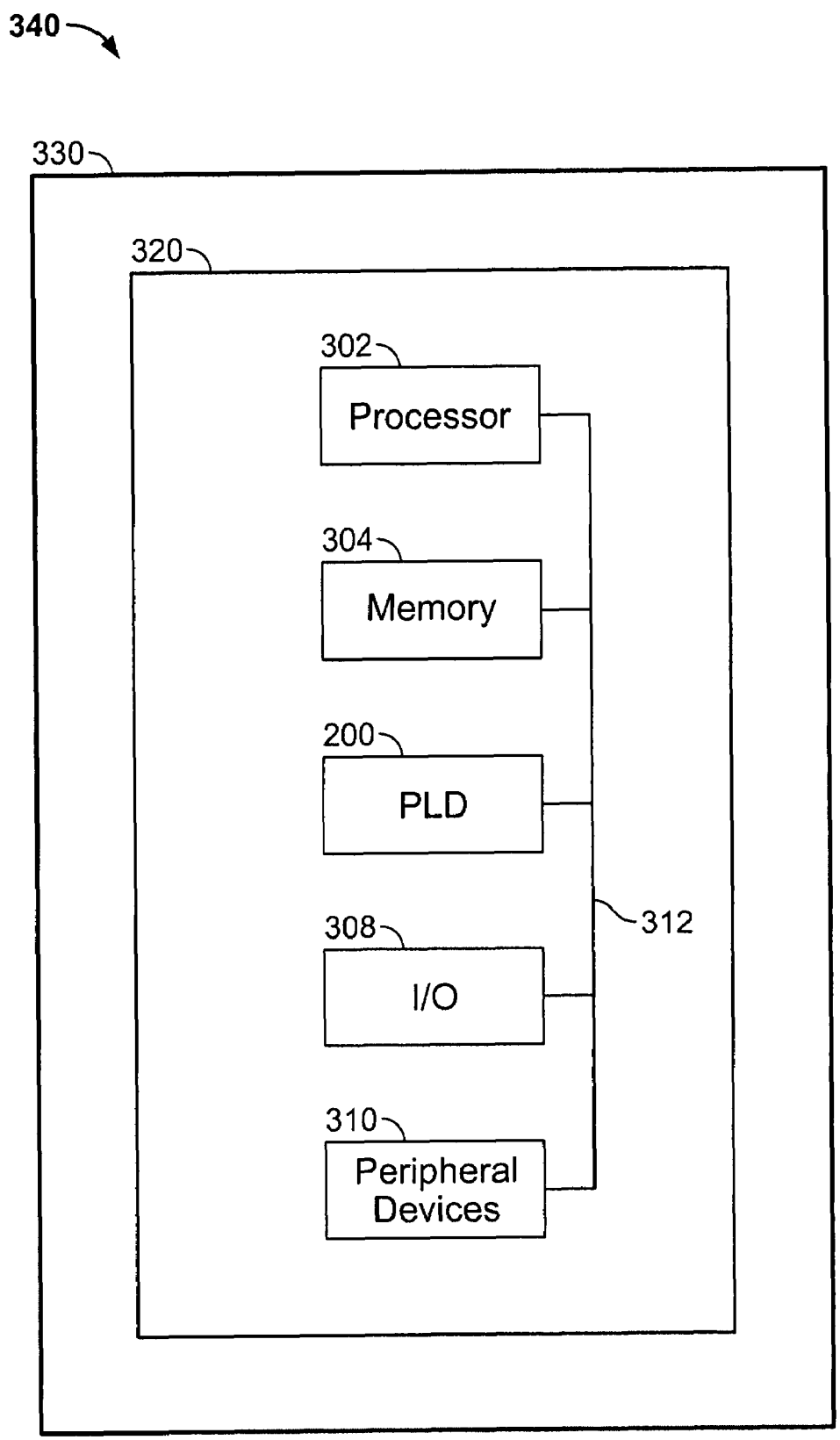
FIG. 3 is a diagram of a system incorporating the invention.

FIG. 3 illustrates a PLD 200, which incorporates the control and configuration unit of the invention, in a data processing system 340. Data processing system 340 may include one or more of the following components: processor 302; memory 304; I/O circuitry 308; and peripheral devices 310. These components are coupled together by a system bus 312 and are populated on a circuit board 320 which is contained in an end-user system 330.

System 340 can be used in a wide variety of applications, such as computer networking, data networking, instrumentation, video processing, or digital signal processing. PLD 200 can be used to perform a variety of different logic functions. For example, PLD 200 can be configured as a processor or controller that works in cooperation with processor 302. PLD 200 may also be used as an arbiter for arbitrating access to a shared resource in system 340. In yet another example, PLD 200 can be configured as an interface between processor 302 and one of the other components in system 340.

Thus it is seen that circuits and methods are provided for performing real-time control and configuration of a PLD using embedded circuitry. One skilled in the art will appreciate that the invention can be practiced by other than the described embodiments, which are presented for purposes of illustration and not of limitation, and the present invention is limited only by the claims which follow.

We claim:

1. A method for configuring a programmable logic device ("PLD"), the method comprising:
   receiving a first signal in said PLD to perform said configuring, wherein said first signal is received through a gigabit media access controller;
   performing a direct memory access from said PLD to retrieve configuration data from a memory; and
   configuring said PLD using a processor on said PLD with said retrieved configuration data.

2. The method of claim 1 further comprising:
   receiving a second signal to enter a mode suitable for configuring said PLD; and
   entering said mode.

3. The method of claim 2 wherein said second signals is received through the gigabit media access controller.

4. The method of claim 1 further comprising executing a startup sequence.

5. The method of claim 1 wherein said configuring is performed in real-time.

6. The method of claim 1 wherein said processor is implemented using hard intellectual property ("IP") circuitry.

* * * * *